(12) United States Patent
Mathe et al.

(10) Patent No.: US 7,768,433 B2
(45) Date of Patent: Aug. 3, 2010

(54) DYNAMIC SLEW RATE CONTROL BASED ON A FEEDBACK SIGNAL

(75) Inventors: Lennart K-A Mathe, San Diego, CA (US); Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 64 days.

(21) Appl. No.: 12/173,006

(22) Filed: Jul. 14, 2008

(65) Prior Publication Data

US 2009/0021409 A1 Jan. 22, 2009

Related U.S. Application Data

(60) Provisional application No. 60/950,061, filed on Jul. 16, 2007.

(51) Int. Cl.
*H03M 3/00* (2006.01)
(52) U.S. Cl. ........................... 341/143; 341/155
(58) Field of Classification Search ............. 341/143, 341/118, 120, 155, 172
See application file for complete search history.

(56) References Cited

U.S. PATENT DOCUMENTS 5,245,343 A * 9/1993 Greenwood et al. ......... 341/143
5,457,714 A 10/1995 Engel et al.
5,691,720 A * 11/1997 Wang et al. ................. 341/143
6,552,676 B1 * 4/2003 Bjorksten et al. ........... 341/143
2006/0220935 A1 * 10/2006 Hughes et al. .............. 341/143

FOREIGN PATENT DOCUMENTS

JP 2006-345405 12/2006

OTHER PUBLICATIONS

International Search Report—PCT/US08/070099—International Search Authority, European Patent Office—Oct. 6, 2008.
Written Opinion—PCT/US08/070099—International Search Authority, European Patent Office—Oct. 6, 2008.
Baswa, S. et al., "Low-Voltage Power-Efficient Adaptive Biasing for CMOS Amplifiers and Buffers", Electronics Letters, Feb. 19, 2004, pp. 216-217, vol. 40, No. 4, IEE online.

(Continued)

*Primary Examiner*—Brian Young
(74) *Attorney, Agent, or Firm*—Jiayu Xu

(57) ABSTRACT

Techniques for enhancing the slew rate of an active circuit within a feedback circuit (such as a ΔΣ ADC) are described. In one design, a ΔΣ ADC includes an integrator, a slew rate enhancement circuit, and a control circuit. The integrator receives an input signal and provides an output signal. The slew rate enhancement circuit enhances the slew rate of the integrator based on a feedback signal in the ΔΣ ADC. The slew rate enhancement circuit may provide (i) a boost current for only certain values (e.g., the largest and smallest values) of the feedback signal or (ii) different amounts of boost current for different values of the feedback signal. In one design, the slew rate enhancement circuit includes at least one boost circuit coupled to the integrator. Each boost circuit provides a boost current to enhance the slew rate of the integrator when that boost circuit is enabled.

29 Claims, 9 Drawing Sheets

OTHER PUBLICATIONS

Ferri, G, "Low-Voltage Low-Power Adaptive Biased High-Efficiency Integrated Amplifiers", Electronics, Circuits and Systems, 2001, ICECS 2001, The 8th IEEE International Conference on, Sep. 2-5, 2001, pp. 1529-1532, vol. 3, IEEE.

Loikkanen, M. et al., "Adaptively Biased Two-Stage Amplifier", IEEE MELECON 2004, May 12-15, 2004, pp. 91-94, Dubrovnik, Croatia.

Parzhuber, H., et al., "An Adaptive Biasing One-Stage CMOS Operational Amplifier for Driving High Capacitive Loads", IEEE Journal of Solid-State Circuits, Oct. 1991, pp. 1457-1460, vol. 26, No. 10, IEEE.

* cited by examiner

DYNAMIC SLEW RATE CONTROL BASED ON A FEEDBACK SIGNAL

I. CLAIM OF PRIORITY UNDER 35 U.S.C. §119

The present application for patent claims priority to Provisional Application Ser. No. 60/950,061, entitled "An Integrator Circuit Dynamic Biasing Technique for Delta-Sigma ADC," filed Jul. 16, 2007, assigned to the assignee hereof, and expressly incorporated herein by reference.

BACKGROUND

I. Field

The present disclosure relates generally to electronics, and more specifically to techniques for enhancing the slew rate of an active circuit within a feedback circuit, e.g., an integrator within a delta-sigma analog-to-digital converter ($\Delta\Sigma$ ADC).

II. Background

A $\Delta\Sigma$ ADC is commonly used to digitize an analog signal and provide digital samples. The $\Delta\Sigma$ ADC typically includes one or more integrators and one or more feedback paths. Each integrator is often implemented with a switched-capacitor circuit composed of an operational transconductance amplifier (OTA), capacitors, and switches.

High performance $\Delta\Sigma$ ADC often mandates fast settling response for the integrators, especially the first integrator, in the $\Delta\Sigma$ ADC. In many cases, the settling response of an integrator is limited by the slew rate of the OTA. Slew rate is the maximum rate at which an output signal can change due to a large change in an input signal. Faster settling response may be achieved with faster slew rate, which may in turn be obtained with higher bias current for the OTA. There is thus a trade-off between slew rate and power consumption. It is desirable to achieve fast settling response without using high bias current since low power consumption is important in modern wireless and portable electronics devices.

SUMMARY

Techniques for enhancing the slew rate of an active circuit within a feedback circuit in order to improve settling response are described herein. In an aspect, fast settling response may be achieved by dynamically applying a boost current that can enhance the slew rate of the active circuit. The amount and/or polarity of the boost current may be controlled based on a feedback signal in the feedback circuit. The feedback signal may be used to predict when the output of the active circuit will have a large positive or negative step. The boost current may be applied only when needed to achieve fast settling response for large positive and negative steps. Good performance may thus be obtained with little additional power. The techniques may be used for various feedback circuits such as $\Delta\Sigma$ ADCs.

In one design, a $\Delta\Sigma$ ADC with slew rate enhancement may receive an analog signal and provide digital samples. The $\Delta\Sigma$ ADC may include an integrator, a slew rate enhancement circuit, and a control circuit. The integrator (which may be the first of multiple integrators in the $\Delta\Sigma$ ADC) may receive an input signal and provides an output signal. The slew rate enhancement circuit may enhance the slew rate of the integrator based on a feedback signal in the $\Delta\Sigma$ ADC. The slew rate enhancement circuit may provide (i) a boost current for only certain values (e.g., the largest and smallest values) of the feedback signal or (ii) different amounts of boost current for different values of the feedback signal. The largest value of the feedback signal may correspond to the largest positive value, and the smallest value of the feedback signal may correspond to the largest negative value.

In one design, the slew rate enhancement circuit may include at least one boost circuit coupled to the integrator. Each boost circuit may provide a boost current to enhance the slew rate of the integrator when that boost circuit is enabled. Each boost circuit may include at least one branch. In one design, each branch may include a resistor and a switch coupled in series and between an integrator output and a supply voltage. In another design, each branch may include a switchable current source. In both designs, a switch for each branch may be closed to provide a boost current for the integrator. A configurable number of branches may be selected to provide a programmable amount of boost current.

In one design, the slew rate enhancement circuit may provide a pulse of boost current to enhance the slew rate of the integrator when the slew rate enhancement circuit is enabled. The duration of the pulse and the amplitude of the boost current may be determined based on the amount of charge to transfer by the integrator in one sample period. The duration of the pulse may be determined based on an RC circuit composed of a first resistor and a first capacitor. The amount of boost current may be determined based on a second resistor. The integrator may perform integration based on a sampling capacitor. The first resistor may track the second resistor over integrated circuit (IC) process variations, and the first capacitor may track the sampling capacitor over IC process variations. This may allow the slew rate enhancement circuit to help transfer a proper amount of charge even with variations in resistor and capacitor values due to IC process variations.

In one design, the slew rate control circuit includes a pulse generator and a control signal generator. The pulse generator may receive a control signal for the integrator and generate a first signal comprising a pulse in each sample period. The control signal generator may generate at least one control signal for the slew rate enhancement circuit based on the first signal and the feedback signal in the $\Delta\Sigma$ ADC.

Various aspects and features of the disclosure are described in further detail below.

DETAILED DESCRIPTION

The techniques described herein may be used for various feedback circuits having active circuits. An active circuit is a circuit comprising an amplifier such as an OTA. An integrator is one example of an active circuit. A feedback circuit is a circuit that provides a feedback signal used to control the operation of one or more circuits within the feedback circuit. For clarity, various aspects of the techniques are described below for a $\Delta\Sigma$ ADC, which is one example of a feedback circuit having an active circuit.

The techniques described herein may be used for various applications such as wireless communication, computing, networking, consumer electronics, etc. The techniques may also be used for various devices such as wireless communication devices, cellular phones, personal digital assistants (PDAs), handheld devices, wireless modems, laptop computers, cordless phones, Bluetooth devices, broadcast receivers, consumer electronics devices, etc. The use of the techniques for a $\Delta\Sigma$ ADC in a wireless communication device, which may be a cellular phone or some other device, is described below.

Figure 1:
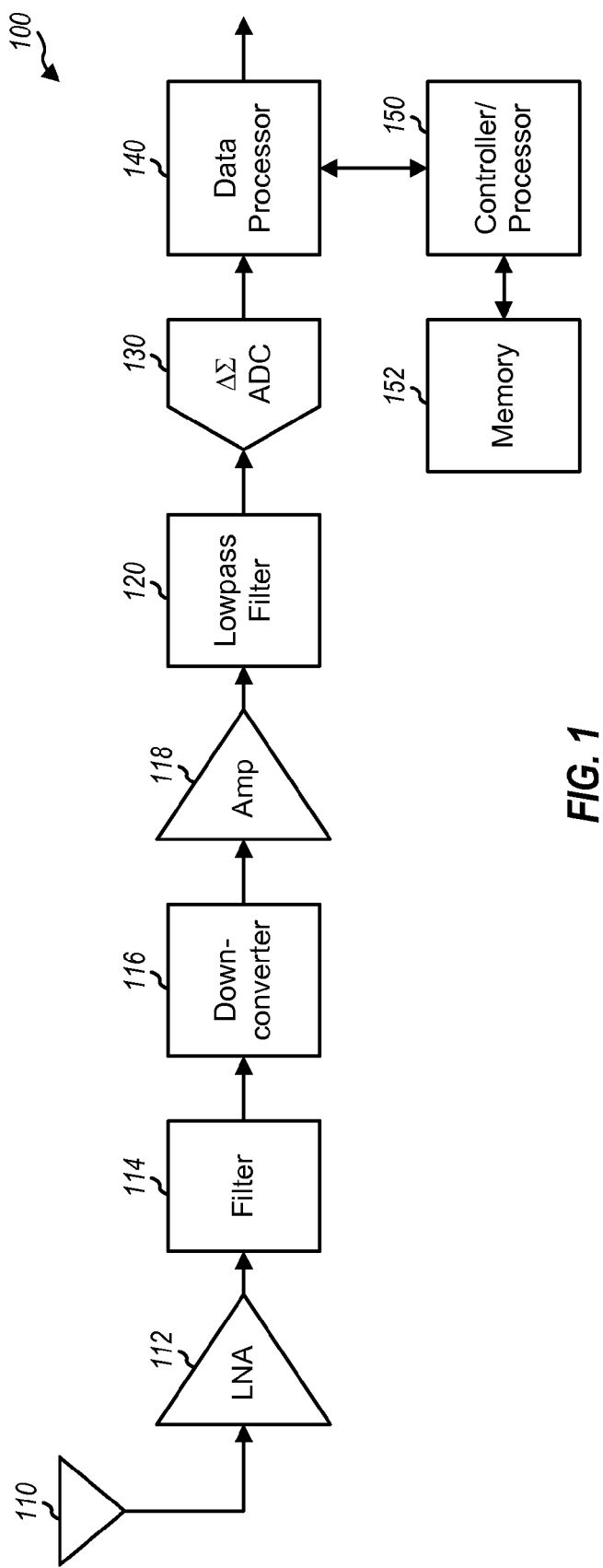
FIG. 1 shows a wireless communication device.

FIG. 1 shows a block diagram of a design of a wireless communication device 100. For simplicity, only the receiver portion is shown in FIG. 1. Also for simplicity, only one receive chain for one antenna is shown in FIG. 1. In general, a wireless device may include any number of receive chains for any number of antennas, any number of frequency bands, and any number of radio technologies.

An antenna 110 may receive radio frequency (RF) modulated signals transmitted by base stations and provide a received RF signal. A low noise amplifier (LNA) 112 may amplify the received RF signal and provide an amplified RF signal. A filter 114 may filter the amplified RF signal to pass signal components in a frequency band of interest and to remove out-of-band noise and undesired signals. A downconverter 116 may frequency downconvert the filtered RF signal with a local oscillator (LO) signal and provide a downconverted signal. The frequency of the LO signal may be selected such that a desired signal in a selected frequency channel is downconverted to baseband, near-baseband, or an intermediate frequency (IF). An amplifier (Amp) 118 may amplify the downconverted signal and provide a signal having a desired signal level. A lowpass filter 120 may filter the signal from amplifier 118 to pass the desired signal in the selected frequency channel and to remove noise and undesired signals, which may be generated by the downconversion process.

A $\Delta\Sigma$ ADC 130 may digitize the analog signal from lowpass filter 120 and provide digital samples to a data processor 140. $\Delta\Sigma$ ADC 130 may provide certain advantages such as better linearity, improved quantization noise characteristics, and simpler implementation over other types of ADC. $\Delta\Sigma$ ADC 130 can perform analog-to-digital conversion of the analog signal by making successive L-bit approximations of the changes in the amplitude of the analog signal at a sampling rate that is many times greater than the desired signal bandwidth, where L may be one or greater. The digital samples may include the desired signal and quantization noise. $\Delta\Sigma$ ADC 130 may be designed such that the quantization noise is pushed (or noise shaped) out of band so that it can be more easily filtered.

Data processor 140 may process the digital samples from $\Delta\Sigma$ ADC 130 to recover data sent to wireless device 100. A controller/processor 150 may control the operation at wireless device 100. A memory 152 may store program codes and data for wireless device 100.

FIG. 1 shows a specific receiver design with a $\Delta\Sigma$ ADC. A receiver may also include different and/or additional circuit blocks not shown in FIG. 1.

$\Delta\Sigma$ ADC 130 may be implemented with various designs such as a single-loop $\Delta\Sigma$ ADC, a cascaded (or MASH) $\Delta\Sigma$ ADC, etc. $\Delta\Sigma$ ADC 130 may also be implemented with any order, e.g., first order, second order, or higher order. $\Delta\Sigma$ ADC 130 may provide digital samples with one or more (L) bits of resolution. In general, higher order and/or more bits may provide better performance at the expense of greater circuit complexity.

Figure 2:
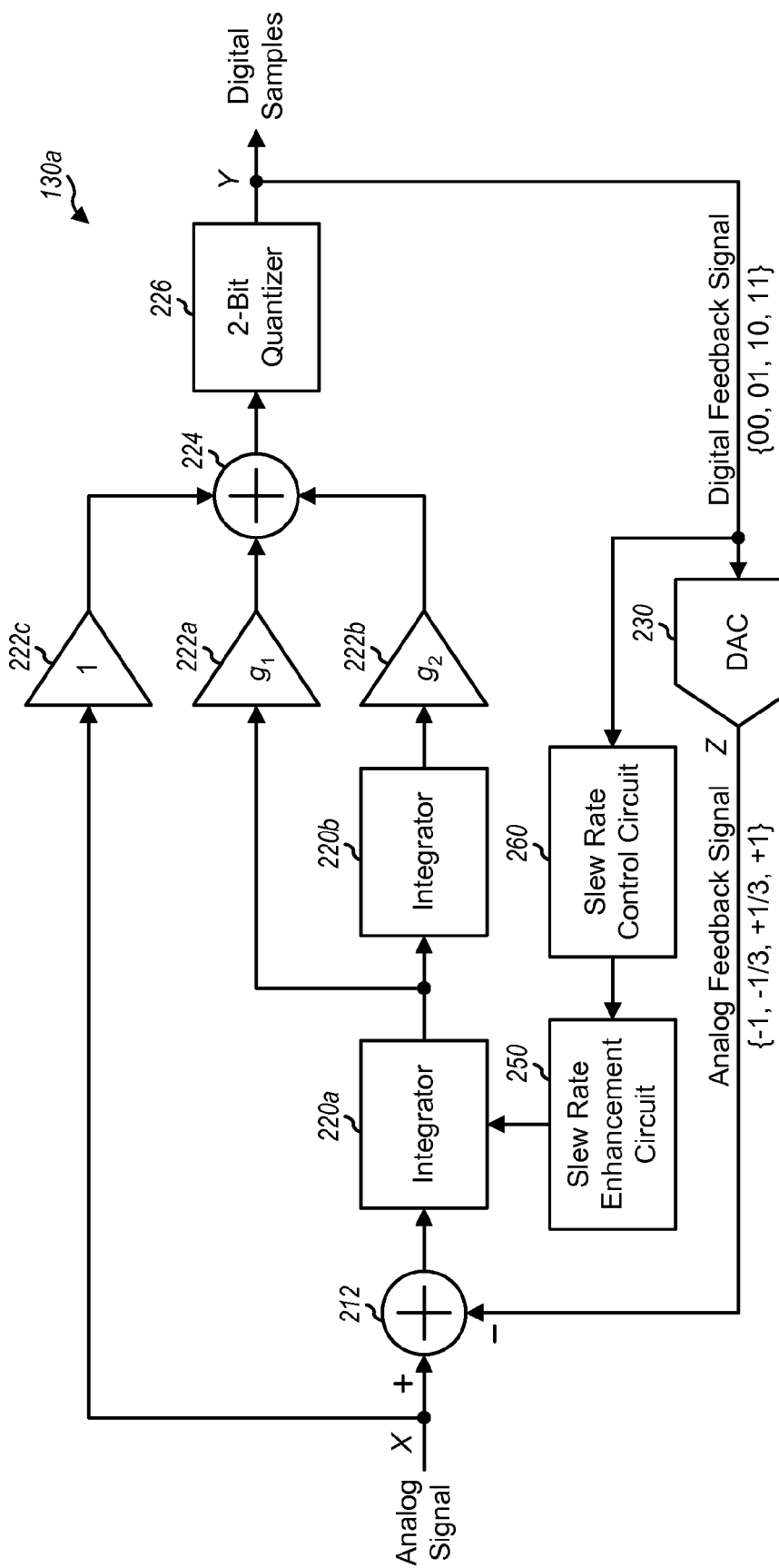
FIG. 2 shows a 2-bit second-order $\Delta\Sigma$ ADC.

FIG. 2 shows a block diagram of a design of a 2-bit second-order $\Delta\Sigma$ ADC 130a with slew rate enhancement. $\Delta\Sigma$ ADC 130a may be used for $\Delta\Sigma$ ADC 130 in FIG. 1. Within $\Delta\Sigma$ ADC 130a, a summer 212 subtracts an analog feedback signal (denoted as z) outputted by a digital-to-analog converter (DAC) 230 from an analog signal (denoted as X). An integrator 220a integrates the output of summer 212 and provides a first integrator output signal. An integrator 220b integrates the first integrator output signal and provides a second integrator output signal. Gain circuits 222a and 222b scale the first and second integrator output signals, respectively, with gains of $g_1$ and $g_2$, respectively. A gain circuit 222c scales the analog signal with a gain of 1. A summer 224 sums the outputs of gain circuits 222a, 222b and 222c and provides an intermediate signal. A quantizer 226 quantizes the intermediate signal and provides 2-bit digital samples (denoted as Y). The digital samples have four possible 2-bit values of 00, 01, 10 and 11. DAC 230 receives a digital feedback signal comprising the digital samples from quantizer 226. DAC 230 converts the digital samples to analog and provides the analog feedback signal having four possible normalized values of −1, −⅓, +⅓, and +1 for digital samples of 00, 01, 10 and 11, respectively. The normalized analog values of −1, −⅓, +⅓, and +1 may correspond to actual analog values of $-V_{ref}$, $-V_{ref}/3$, $+V_{ref}/3$ and $+V_{ref}$, respectively, where $V_{ref}$ is a reference voltage of DAC 230. For simplicity, much of the description below refers to normalized analog values instead of actual analog values. In any case, there is a one-to-one mapping between the values of the digital feedback signal provided to DAC 230 and the values of the analog feedback signal provided by DAC 230.

In the design shown in FIG. 2, a slew rate enhancement circuit 250 couples to first integrator 220a and enhances the slew rate of the integrator, as described below. A slew rate control circuit 260 receives a feedback signal and generates control signals for slew rate enhancement circuit 250. The feedback signal may be the digital feedback signal provided to DAC 230 (as shown in FIG. 2) or the analog feedback signal provided by DAC 230 (not shown in FIG. 2). In general, slew rate enhancement may be applied to any integrator within $\Delta\Sigma$ ADC 130a in order to improve the slew rate and settling response of that integrator.

Figure 3:
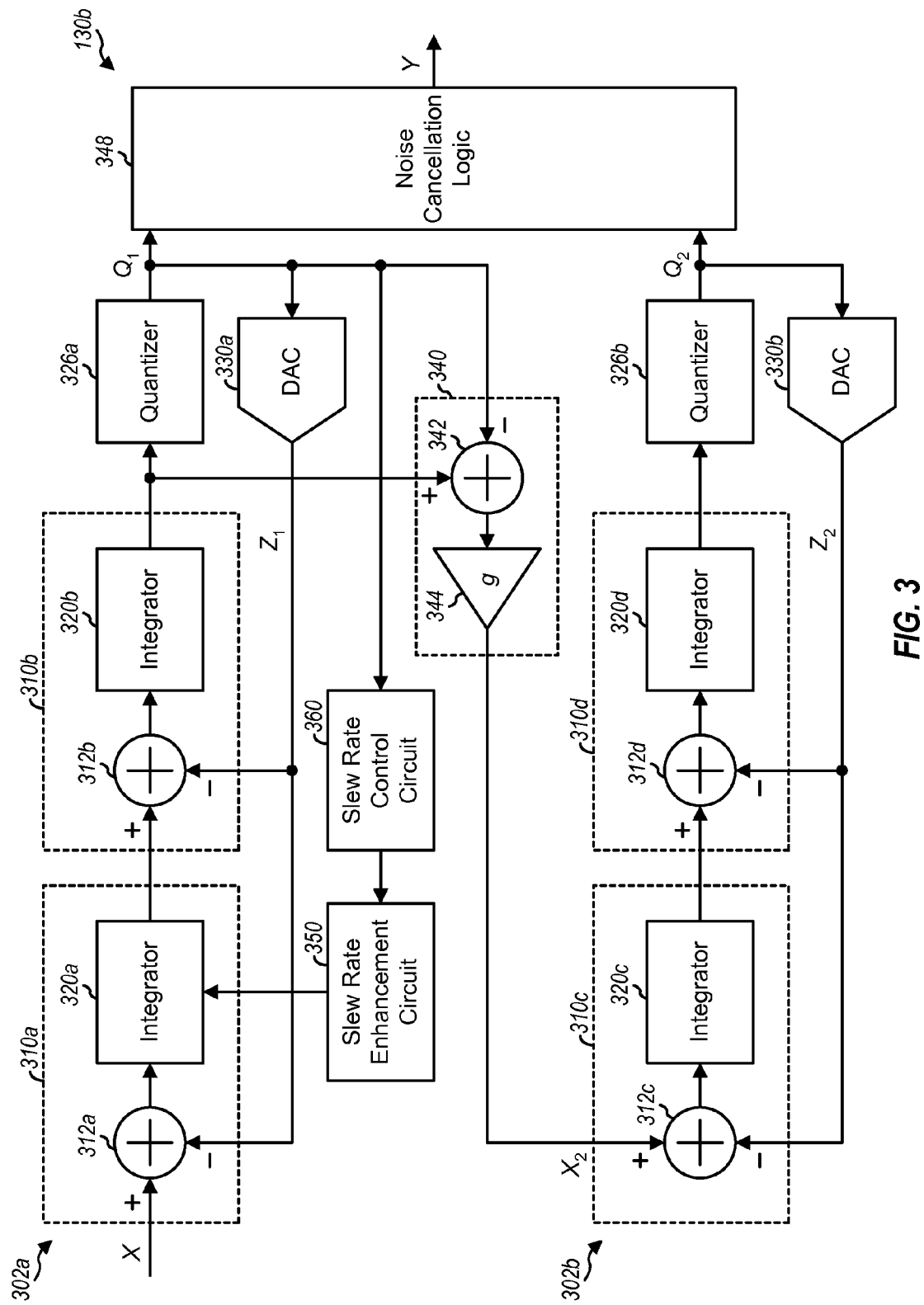
FIG. 3 shows an L-bit fourth-order cascaded $\Delta\Sigma$ ADC.

FIG. 3 shows a block diagram of a design of an L-bit fourth-order cascaded $\Delta\Sigma$ ADC 130b with slew rate enhancement. ADC 130b may also be used for $\Delta\Sigma$ ADC 130 in FIG. 1. $\Delta\Sigma$ ADC 130b includes two loops 302a and 302b, with each loop 302 including two sections 310, a quantizer 326, and a DAC 330. Each section 310 includes a summer 312 coupled in series with an integrator 320.

For each section 310 within first loop 302a, summer 312 subtracts a first analog feedback signal (denoted as $Z_1$) outputted by DAC 330a from a section input signal. Integrator 320 integrates the output of summer 312 and provides a section output signal. Quantizer 326a quantizes an output signal from integrator 320b and provides a first quantized signal (denoted as $Q_1$). DAC 330a converts the first quantized signal to analog and provides the first analog feedback signal.

For each section 310 within second loop 302b, summer 312 subtracts a second analog feedback signal (denoted as $Z_2$) outputted by DAC 330b from a section input signal. Integrator 320 integrates the output of summer 312 and provides a section output signal. Quantizer 326b quantizes an output signal from integrator 320d and provides a second quantized signal (denoted as $Q_2$). DAC 330b converts the second quantized signal to analog and provides the second analog feedback signal.

A circuit 340 determines the quantization error from first loop 302a and generates an input signal (denoted as $X_2$) for second loop 302b. Within circuit 340, a summer 342 subtracts the first quantized signal from the output signal from section 310b. A gain circuit 344 scales the output of summer 342 with a gain of g and provides the $X_2$ signal for second loop 302b. A noise cancellation logic 348 receives the first and second quantized signals from loops 302a and 302b, processes these quantized signals, and provides L-bit digital samples, where $L \geq 1$.

In the design shown in FIG. 3, a slew rate enhancement circuit 350 couples to first integrator 320a and enhances the slew rate of the integrator. A slew rate control circuit 360 receives the first quantized signal as a feedback signal and generates control signals for slew rate enhancement circuit 350. In general, slew rate enhancement may be applied to any integrator within $\Delta\Sigma$ ADC 130b in order to improve the slew rate and settling response of the integrator.

FIGS. 2 and 3 show two example $\Delta\Sigma$ ADCs with slew rate enhancement. A $\Delta\Sigma$ ADC with slew rate enhancement may also be implemented with other designs. For clarity, various aspects of the techniques are described below for 2-bit $\Delta\Sigma$ ADC 130a in FIG. 2.

Each integrator in FIGS. 2 and 3 may be implemented with a switched-capacitor circuit composed of an OTA, capacitors, and switches. All of these circuit elements may be readily fabricated in complementary metal oxide semiconductor (CMOS).

Figure 4:
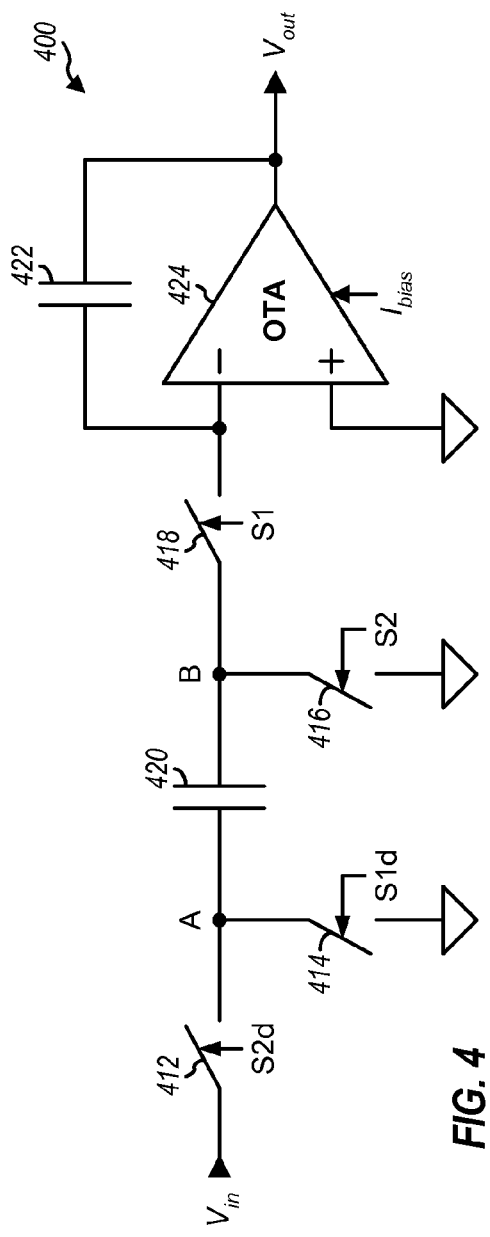
FIG. 4 shows a single-ended integrator without slew rate enhancement.

FIG. 4 shows a schematic diagram of a design of an integrator 400 implemented with a single-sampling switched-capacitor circuit. Integrator 400 may be used for each of the integrators in FIGS. 2 and 3. Within integrator 400, a switch 412 has one end receiving an input signal $V_{in}$ and the other end coupled to node A. A switch 414 is coupled between node A and circuit ground. An input sampling capacitor 420 is coupled between node A and node B. A switch 416 is coupled between node B and circuit ground. A switch 418 is coupled between node B and an inverting input of an OTA 424. The non-inverting input of OTA 424 is coupled to circuit ground. An integrating capacitor 422 is coupled between the inverting input and the output of OTA 424. OTA 424 provides an output signal $V_{out}$. Switches 412, 414, 416 and 418 are controlled by S2d, S1d, S2 and S1 control signals, respectively.

Figure 5:
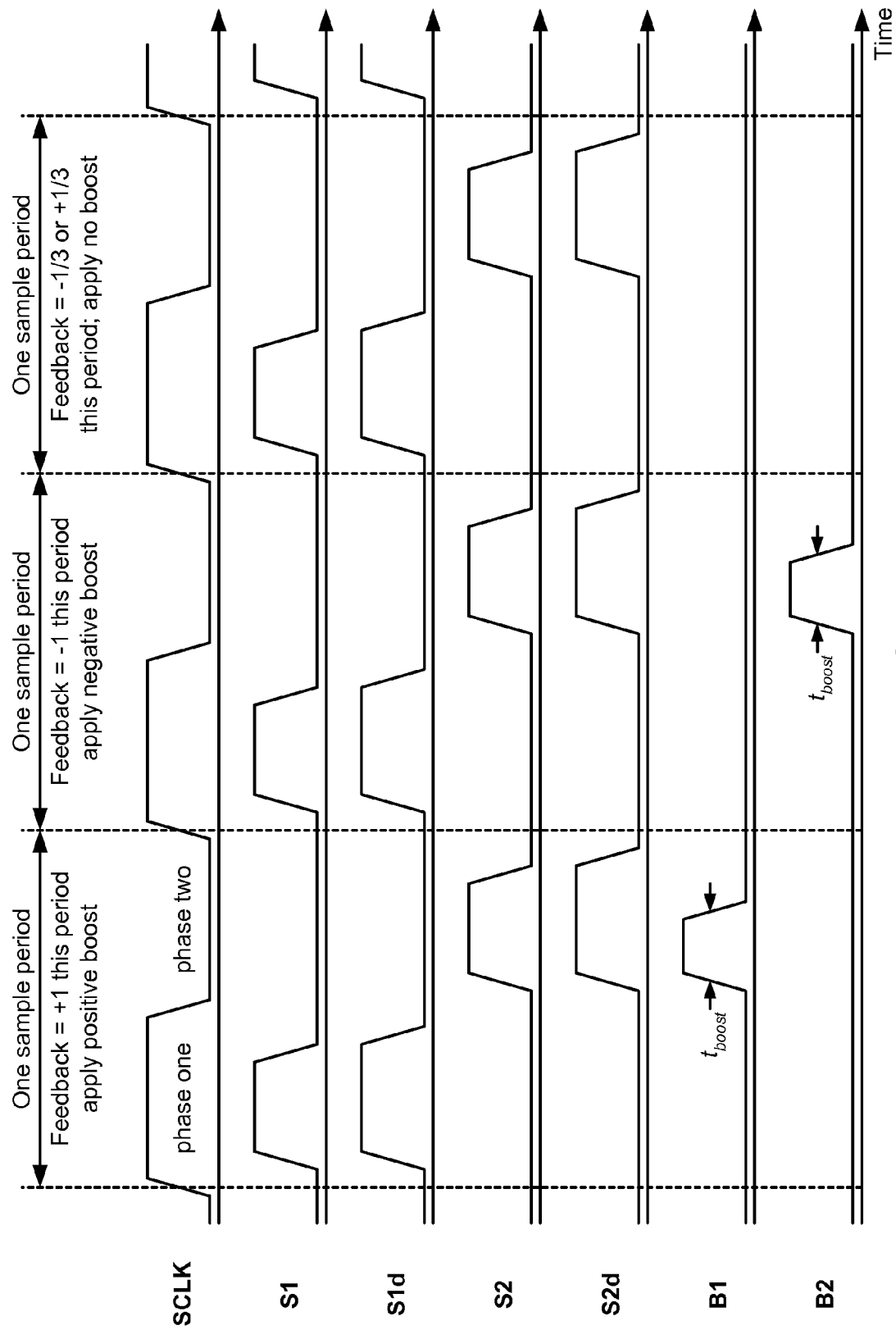
FIG. 5 shows a timing diagram for various control signals in FIG. 4.

FIG. 5 shows a timing diagram for the control signals in FIG. 4. The top of FIG. 5 shows a sampling clock, which has a frequency of $f_{samp}$ and is denoted as SCLK. Each cycle of the sampling clock includes two phases: (i) phase one corresponding to the time in which the sampling clock is at logic high and (ii) phase two corresponding to the time in which the sampling clock is at logic low.

As shown in FIG. 5, the S1 signal is at logic high during phase one and the S2 signal is at logic high during phase two in each sample period. The S1d and S2d signals are extended (or delayed) versions of the S1 and S2 signals, respectively. The S1 and S1d signals are non-overlapping with the S2 and S2d signals. The S1, S1d, S2 and S2d signals have a frequency of $f_{samp}$ and a duty cycle of less than 50%.

Referring back to FIG. 4, integrator 400 operates as follows. During phase two, switches 412 and 416 are closed by the logic high on the S2 and S2d signals, switches 414 and 418 are opened by the logic low on the S1 and Sid signals, and capacitor 420 is charged by the $V_{in}$ signal. During phase one, switches 414 and 418 are closed by the logic high on the S1 and S1d signals, switches 412 and 416 are opened by the logic low on the S2 and S2d signals, and the charge on capacitor 420 is transferred to capacitor 422, which causes the $V_{out}$ signal to vary. In each sampling clock cycle, capacitor 420 is charged by the input signal and subsequently transfers its charge to capacitor 422.

The overall settling response of the integrator output may be dependent on slew-rate limited settling and linear settling. Slew-rate limited settling occurs during the first/early part of the overall settling response when there is a large change in the integrator output. Linear settling occurs during the entire overall settling response. However, linear settling may be negligible in comparison to slew-rate limited settling during the early part and may be more significant in the later part of the overall settling response.

The rate at which charges can be transferred from capacitor 420 to capacitor 422 during the early part of the overall settling response is dependent on the slew rate of OTA 424. It is desirable to have fast slew rate so that all of the charge in capacitor 420 can be transferred to capacitor 422 in a short amount of time. If the slew rate is not sufficiently fast, then capacitor 422 may not be fully charged at the end of the integration phase, and the output of integrator 400 may not settle to the proper value. Error in the final value of capacitor 422 (and of integrator 400) due to incomplete settling may result in a higher noise floor, which may increase quantization noise significantly and degrade the performance of the $\Delta\Sigma$ ADC. Faster slew rate may be obtained by using more bias current for OTA 424. However, using more bias current would increase power consumption, which is undesirable for wireless and portable electronics devices.

In an aspect, fast settling response for an integrator within an $\Delta\Sigma$ ADC may be achieved by dynamically applying a boost current that can speed up the transfer of charge from capacitor 420 to capacitor 422 so that OTA 424 does not enter slew rate limitation. The amount and/or polarity of the boost current may be controlled based on a feedback signal in the $\Delta\Sigma$ ADC. The feedback signal may be used to predict when the output of the integrator will have a large positive or negative step. The boost current may be applied only when needed to achieve fast settling response for large positive and negative steps. Good performance may thus be obtained with little additional power.

Figure 6:
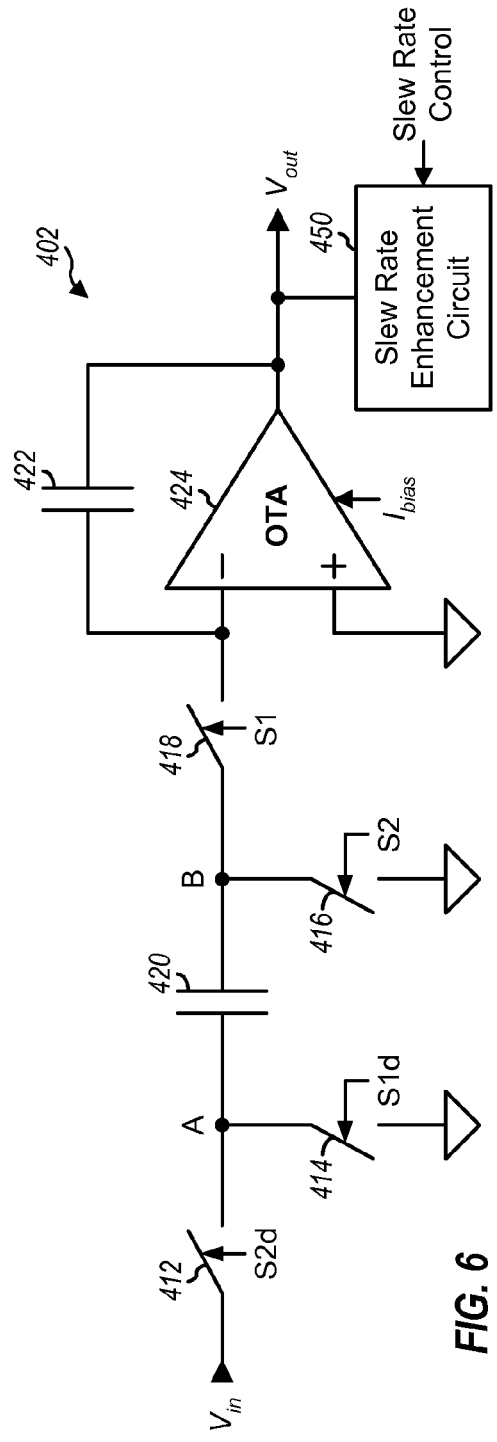
FIG. 6 shows a single-ended integrator with slew rate enhancement.

FIG. 6 shows a schematic diagram of a single-ended design of an integrator 402 with slew rate enhancement. Integrator 402 includes switches 412, 414, 416 and 418, capacitors 420 and 422, and OTA 424, which are described above for FIG. 4. Integrator 402 further includes a slew rate enhancement circuit 450 that receives slew rate control signals and provides a boost current when needed. The slew rate control signals may be generated based on a feedback signal, which may be indicative of the final value of capacitor 422. When the feedback signal indicates a large positive step for capacitor 422, slew rate enhancement circuit 450 may provide a positive boost current that can assist OTA 424 in charging capacitor 422. Conversely, when the feedback signal indicates a large negative step for capacitor 422, slew rate enhancement circuit 450 may provide a negative boost current that can assist OTA 424 in discharging capacitor 422.

Figure 7:
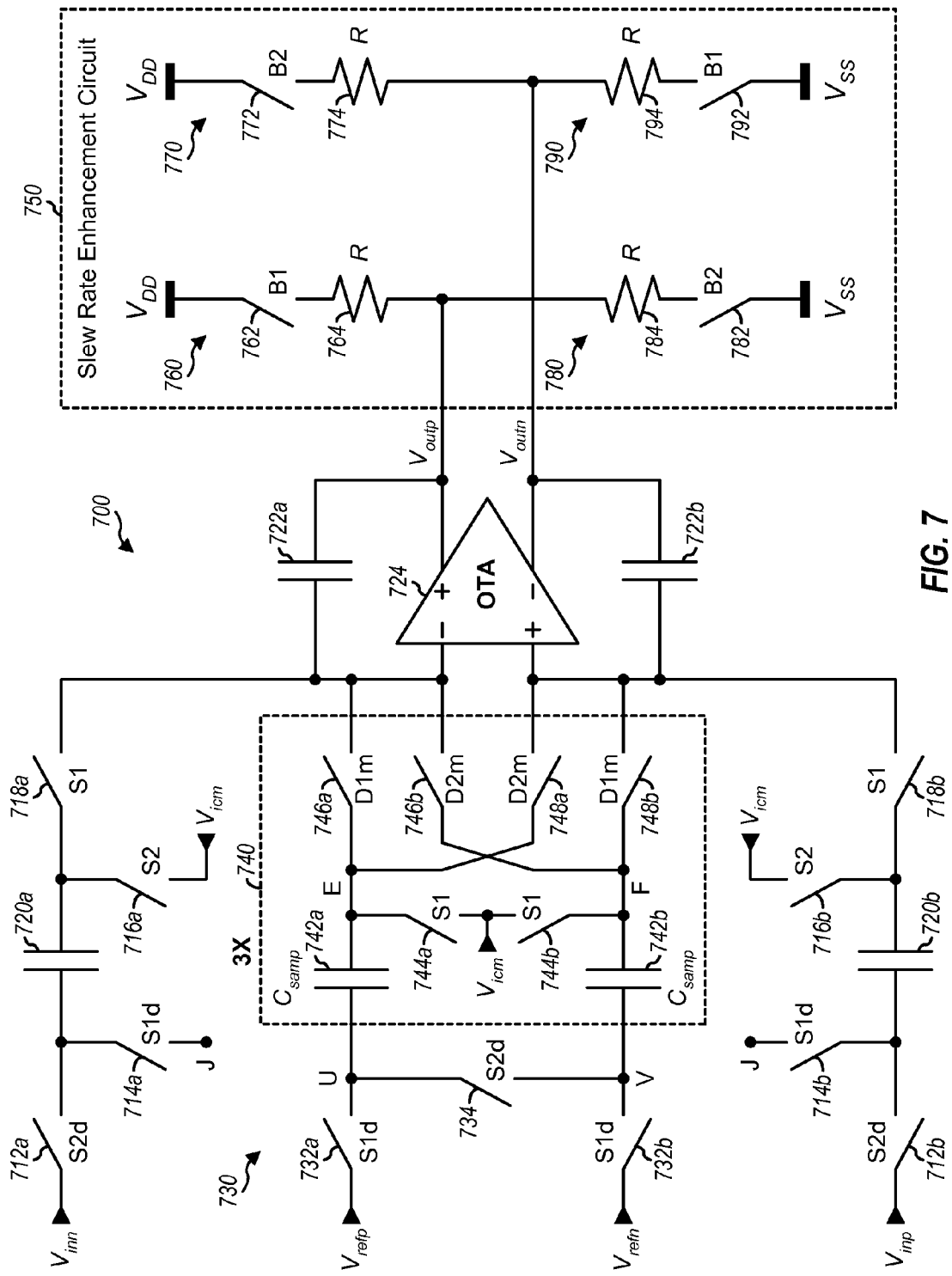
FIG. 7 shows a differential integrator with slew rate enhancement.

FIG. 7 shows a schematic diagram of a differential design of an integrator 700, a DAC 730, and a slew rate enhancement circuit 750, which may be used for integrator 220a, DAC 230, and slew rate enhancement circuit 250, respectively, in FIG. 2, or integrator 320a, DAC 330a, and slew rate enhancement circuit 350, respectively, in FIG. 3. Integrator 700 receives a differential input signal composed of $V_{inp}$ and $V_{inn}$ signals and provides a differential output signal composed of $V_{outp}$ and $V_{outn}$ signals. Slew rate enhancement circuit 750 provides boost currents for the $V_{outp}$ and $V_{outn}$ signals, when needed, in order to achieve fast settling response.

Within integrator 700, switches 712a, 714a, 716a and 718a and capacitors 720a and 722a in the upper path as well as switches 712b, 714b, 716b and 718b and capacitors 720b and 722b in the lower path are coupled in similar manner as switches 412, 414, 416 and 418 and capacitors 420 and 422, respectively, in FIG. 4. Switches 712a and 712b receive the $V_{inn}$ and $V_{inp}$ signals, respectively. Switches 714a and 714b are coupled together at node J, and switches 716a and 716b are coupled to an input common mode voltage $V_{icm}$.

Within DAC 730, a switch 732a has one end receiving a $V_{refp}$ voltage and the other end coupled to node U. A switch 732b has one end receiving a $V_{refn}$ voltage and the other end coupled to node V. A switch 734 is coupled between nodes U and V. For a 4-level DAC, three copies of a reference sampling circuit 740 are coupled in parallel between nodes U and V and the inverting and non-inverting inputs of an OTA 724. Only one copy of circuit 740 is shown in FIG. 7 for simplicity. For each copy of circuit 740, a reference sampling capacitor 742a is coupled between node U and node E, and a reference sampling capacitor 742b is coupled between nodes V and node F. Switches 744a and 744b are coupled in series and between nodes E and F. Switches 746a and 748a are coupled between node E and the inverting and non-inverting inputs, respectively, of OTA 724. Switches 746b and 748b are coupled between node F and the inverting and non-inverting inputs, respectively, of OTA 724. Switches 746a and 748a are controlled by a D1m control signal, and switches 746b and 748a are controlled by a D2m control signal, where m may be equal to 1, 2 and 3 for copies 1, 2 and 3, respectively, of circuit 740. The D1m and D2m signals for the three copies of circuit 740 are generated based on the S2 signal and the feedback signal. In particular, the D1m and D2m signals are enabled or disabled based on the feedback signal and, if enabled, are active during the time in which the S2 signal is active.

The three copies of circuit 740 are used to sample a differential reference voltage defined by the $V_{refp}$ and $V_{refn}$ voltages. For each copy of circuit 740, either the D1m or D2m signal is enabled in each sample period. When the D1m signal is enabled, node E is coupled to the inverting input of OTA 724 via switch 746a, and node F is coupled to the non-inverting input of OTA 724 via switch 748b. Conversely, when the D2m signal is enabled, node E is coupled to the non-inverting input of OTA 724 via switch 748a, and node F is coupled to the inverting input of OTA 724 via switch 746b.

When the feedback signal is +1, the D1m signals for all three copies of circuit 740 are enabled, and capacitors 742 in all three copies of circuit 740 are coupled in the same direction and provide three units of positive stored charge. When the feedback signal is −1, the D2m signals for all three copies of circuit 740 are enabled, and capacitors 742 in all three copies of circuit 740 are coupled in the same direction and provide three units of negative stored charge. When the feedback signal is +⅓, the D1m signals for two copies of circuit 740 are enabled, the D2m signal for the remaining copy of circuit 740 is enabled, and capacitors 742 in the three copies of circuit 740 provide one unit of positive stored charge. When the feedback signal is −⅓, the D2m signal for two copies of circuit 740 are enabled, the D1m signal for the remaining copy of circuit 740 is enabled, and capacitors 742 in the three copies of circuit 740 provide one unit of negative stored charge.

In the design shown in FIG. 7, capacitors 720a and 720b sample the $V_{inn}$ and $V_{inp}$ signals during phase two with the S2 signal whereas capacitors 742a and 742b sample the $V_{refp}$ and $V_{refn}$ signals during phase one with the S1 signal. Capacitors 720a and 720b provide their stored charges to capacitors 722a and 722b during phase one, and capacitors 742a and 742b provide their stored charges to capacitors 722a and 722b during phase two. The input signal and the reference voltage are thus sampled on alternating clock phases and are also integrated on alternating clock phases. This alternate sampling of the input signal and the reference voltage (i) allows for separate integration of the input signal and the DAC feedback signal and (ii) allows the integrator load to be balanced between phases one and two of the sampling clock.

In the design shown in FIG. 7, slew rate enhancement circuit 750 includes positive boost circuits 760 and 790 and negative boost circuits 770 and 780. Boost circuit 760 includes a switch 762 and a resistor 764 coupled in series and between a positive supply voltage $V_{DD}$ and the $V_{outp}$ output. Boost circuit 770 includes a switch 772 and a resistor 774 coupled in series and between the $V_{DD}$ supply and the $V_{outn}$ output. Boost circuit 780 includes a switch 782 and a resistor 784 coupled in series and between a negative supply voltage $V_{SS}$ and the $V_{outp}$ output. Boost circuit 790 includes a switch 792 and a resistor 794 coupled in series and between the $V_{SS}$ supply and the $V_{outn}$ output. $V_{SS}$ may be circuit ground or some other voltage. Other voltages may also be used instead of $V_{DD}$ and $V_{SS}$ in FIG. 7. Switches 762 and 792 are controlled by a B1 control signal, and switches 772 and 782 are controlled by a B2 control signal.

FIG. 5 shows a design of the B1 and B2 signals for 2-bit ΔΣ ADC 130a shown in FIG. 2. In this design, a positive boost is applied when the feedback signal is +1, a negative boost is applied when the feedback signal is −1, and no boost is applied when the feedback signal is −⅓ or +⅓. The B1 and B2 signals are each enabled for a short period at the beginning of when the S2 signal is enabled.

In the design shown in FIG. 7, the boost current is applied when the stored charges from capacitors 742a and 742b are integrated and transferred to capacitors 722a and 722b. The boost current is not applied when the stored charges from capacitors 720a and 720b are integrated and transferred to capacitors 722a and 722b. This design may provide the advantages described above, e.g., isolation of the DAC output and control of switches 762, 772, 782 and 792 with only the feedback signal. In general, the boost current may be applied when integrating the charges from capacitors 742 and/or when integrating the charges from capacitors 720.

Table 1 shows a design of dynamic slew rate control for 2-bit ΔΣ ADC 130a in FIG. 2. ΔΣ ADC 130a may provide digital samples having four possible 2-bit values of 00, 01, 10 and 11. DAC 230 may provide the analog feedback signal having four possible normalized values of −1, −⅓, +⅓, and +1 for digital samples of 00, 01, 10 and 11, respectively. The largest positive step may occur when the feedback signal is equal to +1, and the largest negative step may occur when the feedback signal is equal to −1. Slew-limited settling may occur especially for the cases in which the feedback signal is equal to +1 or −1. The feedback information may be used to determine when to provide boost current as well as the polarity/direction of the boost current.

In the design shown in FIG. 7 and Table 1, when the feedback signal is +1, the B1 signal is enabled as shown in FIG. 5, and switches 762 and 792 are closed. A positive boost current is provided by the $V_{DD}$ supply via switch 762 and resistor 764 for the $V_{outp}$ signal. A positive boost current is also provided by the $V_{SS}$ supply via switch 792 and resistor 794 for the $V_{outn}$ signal. When the feedback signal is −1, the B2 signal is enabled as shown in FIG. 5, and switches 772 and 782 are closed. A negative boost current is provided by the $V_{DD}$ supply via switch 772 and resistor 774 for the $V_{outn}$ signal. A negative boost current is also provided by the $V_{SS}$ supply via switch 782 and resistor 784 for the $V_{outp}$ signal. When the feedback signal is either −⅓ or +⅓, the B1 and B2 signals are both disabled as shown in FIG. 5, and switches 762, 772, 782 and 792 are opened.

TABLE 1

| Digital Sample | Feedback Signal | B1 Signal | B2 Signal | Switch Configuration | Switch Configuration |
|---|---|---|---|---|---|
| 00 | −1 | Disable | Enable | Switches 772 and 782 are closed and other switches are opened | Negative boost current is supplied via resistors 774 and 784 |
| 01 | −⅓ | Disable | Disable | All switches are open | No boost is applied |
| 10 | +⅓ | Disable | Disable | All switches are open | No boost is applied |
| 11 | +1 | Enable | Disable | Switches 762 and 792 are closed and other switches are opened | Positive boost current is resistors via resistors 764 and 794 |

Figure 8:
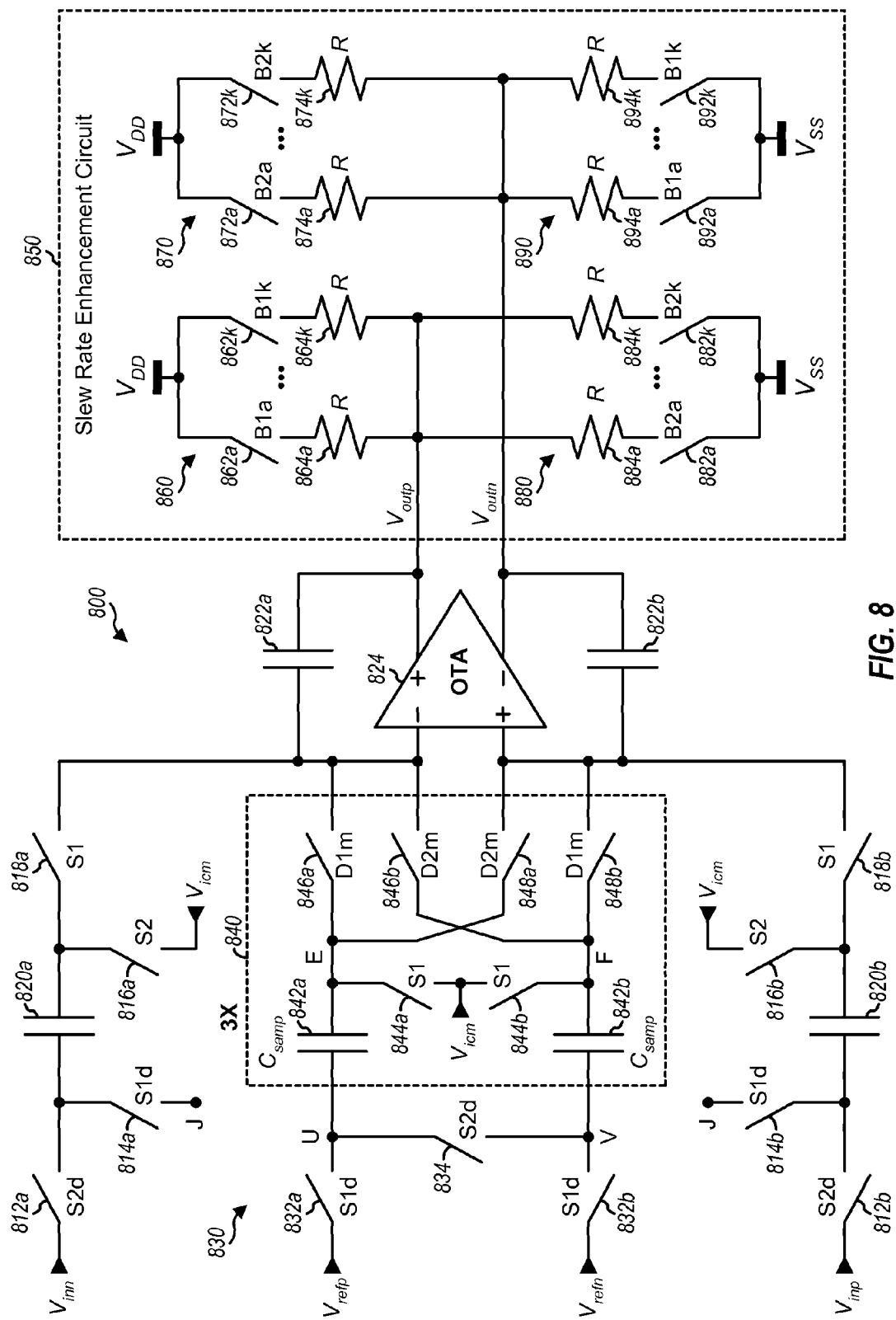
FIG. 8 shows a differential integrator with programmable slew rate enhancement.

FIG. 8 shows a schematic diagram of a differential design of an integrator 800, a DAC 830, and a programmable slew rate enhancement circuit 850, which may also be used for integrator 220a, DAC 230, and slew rate enhancement circuit 250, respectively, in FIG. 2, or integrator 320a, DAC 330a, and slew rate enhancement circuit 350, respectively, in FIG. 3. Integrator 800 and DAC 830 include circuit elements 812a through 848b that are coupled in the same manner as circuit elements 712a through 748b within integrator 700 and DAC 730 in FIG. 7. Slew rate enhancement circuit 850 can provide a programmable boost current for the $V_{outn}$ and $V_{outp}$ signals, when needed, in order to achieve fast settling response.

In the design shown in FIG. 8, boost circuit 850 includes positive boost circuits 860 and 890 and negative boost circuits 870 and 880. Boost circuit 860 includes K switches 862a through 862k coupled in series with K resistors 864a through 864k, respectively. Each series combination of switch 862 and resistor 864 is coupled between the $V_{DD}$ supply and the $V_{outp}$ output. Boost circuit 870 includes K switches 872a through 872k coupled in series with K resistors 874a through 874k, respectively. Each series combination of switch 872 and resistor 874 is coupled between the $V_{DD}$ supply and the $V_{outn}$ output. Boost circuit 880 includes K switches 882a through 882k coupled in series with K resistors 884a through 884k, respectively. Each series combination of switch 882 and resistor 884 is coupled between the $V_{SS}$ supply and the $V_{outp}$ output. Boost circuit 890 includes K switches 892a through 892k coupled in series with K resistors 894a through 894k, respectively. Each series combination of switch 892 and resistor 894 is coupled between the $V_{SS}$ supply and the $V_{outn}$ output. In general, K may be any integer value, and any number of resistor branches may be used for each of boost circuits 860 to 890. A larger value of K may provide more resolution for the programmed boost current.

Switches 862a through 862k and switches 892a through 892k are controlled by B1a through B1k control signals, respectively. Switches 872a through 872k and switches 882a through 882k are controlled by B2a through B2k control signals, respectively. Different amounts of positive boost current may be obtained by enabling different numbers of B1 signals when the feedback signal is +1. Different amounts of negative boost current may be obtained by enabling different numbers of B2 signals when the feedback signal is −1. For example, the smallest amount of positive boost current may be obtained by enabling only the B1a signal, and the largest amount of positive boost current may be obtained by enabling all K B1a through B1k signals.

The design shown in FIG. 8 allows for a programmable amount of boost current to be applied for slew rate enhancement. The programmable amount of boost current may be beneficial for various scenarios. In one design, the programmability feature may be used to obtain the desired amount of boost current for different reference voltages. In another design, the programmability feature may be used to obtain different amounts of boost current for different operating modes, which may have different sampling rates. For example, a wireless device may operate in either a WCDMA mode with a wideband signal or a GSM mode with a narrowband signal. More boost current may be used for the WCDMA mode, which may have a higher sampling rate and may thus require a shorter settling time. Less boost current or no boost current may be used for the GSM mode, which may have a lower sampling rate and may thus be able to tolerate a longer settling time. In yet another design, the programmability feature may be used to support different numbers of quantization levels. For example, for a 6-level ΔΣ modulator with relative output values of −5, −3, −1, +1, +3 and +5, a maximum boost may be applied for the −5 and +5 levels, half of the maximum boost may be applied for the −3 and +3 levels, and no boost may be applied for the −1 and +1 levels. The programmable amount of boost current may also be used for other scenarios.

Figure 9:
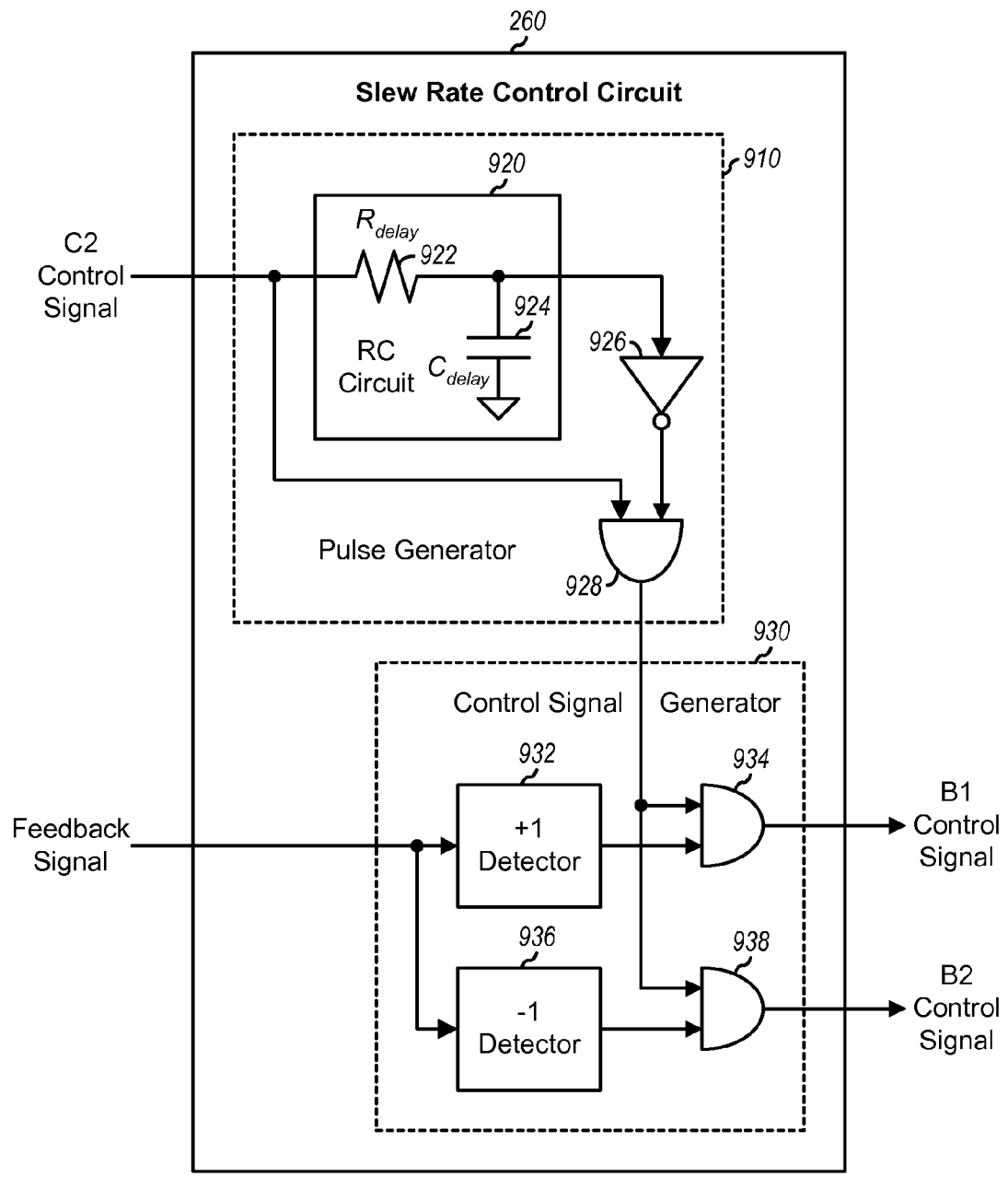
FIG. 9 shows a slew rate control circuit.

FIG. 9 shows a block diagram of a design of slew rate control circuit 260 in FIG. 2. Circuit 260 includes a pulse generator 910 and a control signal generator 930. Pulse generator 910 receives the C2 control signal for ΔΣ ADC 130a and provides a pulse in each sample period. Within pulse generator 910, an RC circuit 920 receives the C2 signal and provides a delayed C2 signal. RC circuit 920 includes a resistor 922 having a value of $R_{delay}$ and a capacitor 924 having a value of $C_{delay}$. An inverter 926 inverts the delayed C2 signal from RC circuit 920 and provides an inverted C2 signal. An AND gate 928 receives the C2 signal and the inverted C2 signal and provides a first signal comprising a pulse in each sample period. The width of each pulse is determined by the $R_{delay}$ and $C_{delay}$ values.

Within control signal generator 930, a detector 932 receives the feedback signal, detects for +1, and provides a logic high output whenever +1 is detected. An AND gate 934 receives the first signal from pulse generator 910 and the output of detector 932 and generates the B1 control signal. The B1 signal is enabled whenever +1 is detected and has a pulse duration determined by the first signal from pulse generator 910. Similarly, a detector 936 receives the feedback signal, detects for −1, and provides a logic high output whenever −1 is detected. An AND gate 938 receives the first signal from pulse generator 910 and the output of detector 936 and generates the B2 control signal. The B2 signal is enabled whenever −1 is detected and has a pulse duration determined by the first signal from pulse generator 910.

FIG. 9 shows a specific design of slew rate control circuit 260. The slew rate control signals for the slew rate enhancement circuit may also be generated in other manners. For example, in another design, RC circuit 920 may be replaced with multiple inverters coupled in series. The number of inverters may be fixed or programmable.

In one design, slew rate enhancement is enabled for only a sufficient amount of time to transfer the charges from sampling capacitors (e.g., capacitors 742a and 742b in FIG. 7) to integrating capacitors (e.g., capacitors 722a and 722b in FIG. 7) and is disabled the remaining time. Slew rate enhancement is achieved by sourcing or sinking a well-controlled current pulse when necessary. The amount and direction of the current pulse may be controlled digitally and dynamically. The current pulse may be turned on only when there is a large slewing event from the DAC feedback path. After the predetermined short duration of the current pulse, the integrator behaves in the normal manner as if no current boosting has occurred. Thus, linear settling, bandwidth, and noise performance are not affected by the slew rate enhancement circuit. Furthermore, no extra quiescent current is drawn from the slew rate enhancement circuit.

For the design shown in FIG. 7, each of boost circuits 760 to 790 provides a current pulse when that boost circuit is enabled by the applicable B1 or B2 signal. The width and amplitude of the current pulse may be determined based on the amount of charge to transfer from sampling capacitors 742 to integrating capacitors 722. The amount of charge to transfer in one sample period may be expressed as:

$$(I_{bias}+I_{boost}) \cdot t_{boost} = \Delta Q = V_{ref} \cdot C_{samp}, \quad \text{Eq (1)}$$

where $I_{bias}$ is a static bias current for OTA 724, $I_{boost}$ is the boost current provided by slew rate enhancement circuit 750, $t_{boost}$ is the time duration in which $I_{boost}$ is applied to OTA 724, $C_{samp}$ is the capacitance of sampling capacitor 742a or 742b, $V_{ref}$ is a DAC reference voltage, and $\Delta Q$ is the amount of charge resulting from $I_{bias}$ and $I_{boost}$ being applied for a duration of $t_{boost}$.

The reference voltage may be expressed as:

$$V_{ref} = V_{refp} - V_{refn}. \quad \text{Eq (2)}$$

The average differential boost current may be expressed as:

$$I_{boost} = \frac{V_{DD} - V_{odm}}{2 \cdot R}, \quad \text{Eq (3)}$$

where $V_{odm}$ is an output differential mode voltage. As shown in equation (3), the amount of boost current is inversely proportional to the value R of resistor 764, 774, 784 or 794 within slew rate enhancement circuit 750. For example, if the resistor value R is reduced from 600 ohms to 300 ohms, then the amount of boost current may be doubled.

As an example, slew rate enhancement may be used for integrator 220a in ΔΣ ADC 130a in FIG. 2. A boost pulse width of 1 nanosecond (ns) may be selected based on the desired overall settling response. Integrator 220a may be designed with $V_{ref}$=1.2 volts (V), $C_{samp}$=2.1 pico-Farads (pF), and $I_{bias}$=0.625 micro-Amperes (µA). From equation (1), the desired amount of boost current may be given as:

$$I_{boost} = \frac{V_{ref} \cdot C_{samp}}{t_{boost}} - I_{bias} \quad \text{Eq (4)}$$

$$= \frac{1.2 \text{ V} \times 2.1 \text{ pF}}{1.0 \text{ ns}} - 0.625 \text{ µA}$$

$$= 1.9 \text{ mA}.$$

If $V_{DD}$=2.1 V and the output differential voltage is $V_{odm}$=0.5 V, then the resistor value R in each boost circuit may be given as:

$$R = \frac{V_{DD} - V_{odm}}{2 \cdot I_{boost}} = \frac{2.2 \text{ V} - 0.5 \text{ V}}{3.8 \text{ mA}} = 447 \text{ Ω}. \quad \text{Eq (5)}$$

Resistors 764, 774, 784 and 794 may be set to 447 ohms to obtain a boost current that can transfer a charge of 2.52 pico-Coulombs (pC) from sampling capacitors 742a and 742b to integrating capacitors 722a and 722b, respectively, in one sample period. The amount of boost current may be adjusted by varying the value of resistors 764, 774, 784 and 794. Resistors 764 and 774 may have the same value as resistors 784 and 794, or these resistors may have different values, depending on the various voltages used for the integrator and the slew rate enhancement circuit.

The duration of the boost current pulse may be controlled with RC circuit 920 in FIG. 9, which has a resistor value of $R_{delay}$ and a capacitor value of $C_{delay}$. The duration of the current pulse may be expressed as:

$$t_{boost} \propto R_{delay} \cdot C_{delay}. \quad \text{Eq (6)}$$

The use of RC circuit 920 to generate pulses for the B1 and B2 signals may (i) allow capacitor 924 in the RC circuit to track variations of capacitors 742a and 742b in integrator 700 and (ii) allow resistor 922 in the RC circuit to track variations of resistors 764, 774, 784 or 794 in slew rate enhancement circuit 750. The resistor and capacitor values may vary due to variations in IC process, temperature, etc. The duration of the pulses on the B1 and B2 signals may be varied automatically to account for variations in the resistor and capacitor values. This may then allow the proper amount of charge ΔQ to be transferred even with variations in resistor and capacitor values, assuming that the capacitors and resistors match.

The capacitor and resistor tracking via the use of RC circuit 920 may ensure that the charge remains constant across resistor and capacitor variations. For example, the pulse duration may be extended for a larger resistor value, which may reduce the amount of boost current and thus require more time to transfer the charge from the sampling capacitor to the integrating capacitor. The pulse duration may also be extended for a larger capacitor value, which may increase the amount of charge to transfer thus require more time for the charge transfer. For example, if the value R of resistors 764, 774, 784 and 794 increases by 10% due to IC process variations, then the boost current $I_{boost}$ may be reduced by 10%. However, the value $R_{delay}$ of resistor 922 within RC circuit 920 will also increase by 10%, and the boost pulse duration $t_{boost}$ would then increase by 10%. Therefore, the total charge $Q_{boost} = I_{boost} \cdot t_{boost}$ provided by slew rate enhancement circuit 750 would remain constant even though the resistor value has increased by 10%.

To track over IC process variations, resistor 922 in RC circuit 920 and resistors 764, 774, 784 or 794 in slew rate enhancement circuit 750 should be of the same type. These resistors may be base-diffused resistors, emitter-diffused resistors, ion-implanted resistors, pinch resistors, epitaxial resistors, pinched epitaxial resistors, thin-film resistors, or some other type of resistors. Similarly, capacitor 924 in RC circuit 920 and sampling capacitors 742a and 742b in integrator 700 should also be of the same type. These capacitors may be implemented with pn junctions under reverse bias and MOS capacitor structures. Capacitors 720a, 720b, 722a, 722b, 742a and 742b should also track one another over IC process and temperature variations.

In the description above, slew rate enhancement is applied to the first integrator in a ΔΣ ADC. Fast settling response may be more important in the first integrator because non-linear settling errors of subsequent integrators is divided by the first integrator gain when input referred and therefore has less impact on signal-to-noise-plus-distortion ratio (SNDR) than the first integrator. Slew rate enhancement may provide fast settling response for the first integrator with very small cost in power consumption and additional circuit. Slew rate enhancement may also be applied to any remaining integrator in the ΔΣ ADC to possibly improve performance.

For clarity, slew rate enhancement for feedback values of +1 and −1 from a 2-bit ΔΣ ADC have been described above. In general, slew rate enhancement may be applied to ΔΣ ADCs with any number of output bits, e.g., 1-bit output, 2-bit output, 3-bit output, etc. Furthermore, slew rate enhancement may be applied to all or a subset of the possible output values. In one design, slew rate enhancement may be applied for only the largest and smallest output values, as described above. In another design, slew rate enhancement may be applied to additional output values for ΔΣ ADCs with more than one bit output. The same amount of boost current may be applied to each output value. Alternatively, different amounts of boost current may be applied to different output values. For example, more boost current may be applied for output values of +1 and −1, and less boost current may be applied for output values of +⅓ and −⅓.

The overall settling response of an integrator may be dependent on slew-rate limited settling and linear settling, as described above. When operating at high frequency, the slew-rate limited settling time may be more than 50% of the overall settling time for large positive and negative steps and may thus have a large impact on the performance of the integrator. Slew rate enhancement may be enabled in order to reduce the slew-rate limited settling time of the integrator for DAC feedback value of −1 or +1. For DAC feedback value of −⅓ or +⅓, the slew-rate limited settling time of the integrator may be negligible, and slew rate enhancement may therefore be disabled.

Figure 10:
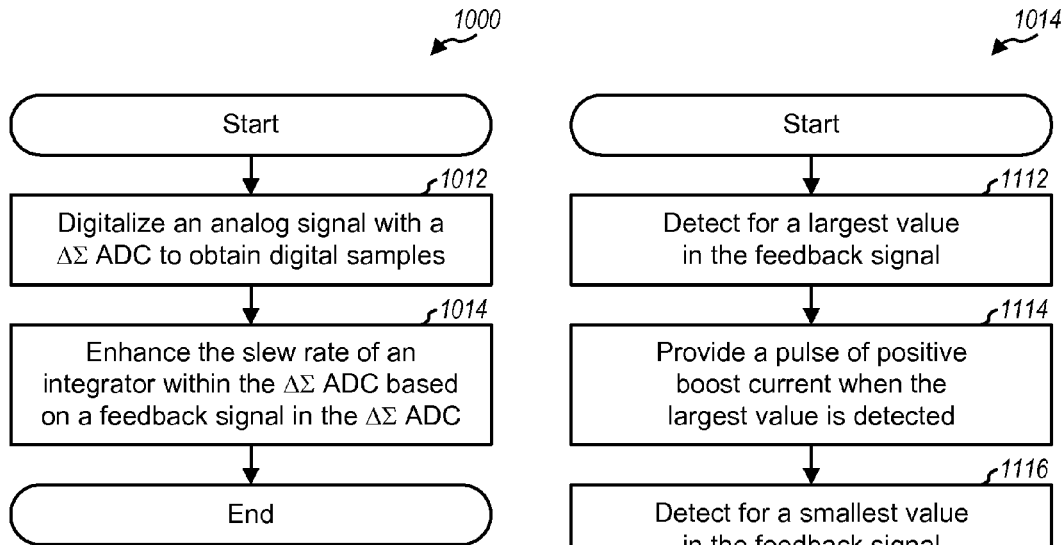
FIG. 10 shows a process for operating a $\Delta\Sigma$ ADC with slew rate enhancement.

FIG. 10 shows a design of a process 1000 for operating a ΔΣ ADC with slew rate enhancement. An analog signal may be digitalized with the ΔΣ ADC to obtain digital samples (block 1012). The slew rate of an integrator within the ΔΣ ADC may be enhanced based on a feedback signal in the ΔΣ ADC (block 1014).

Figure 11:
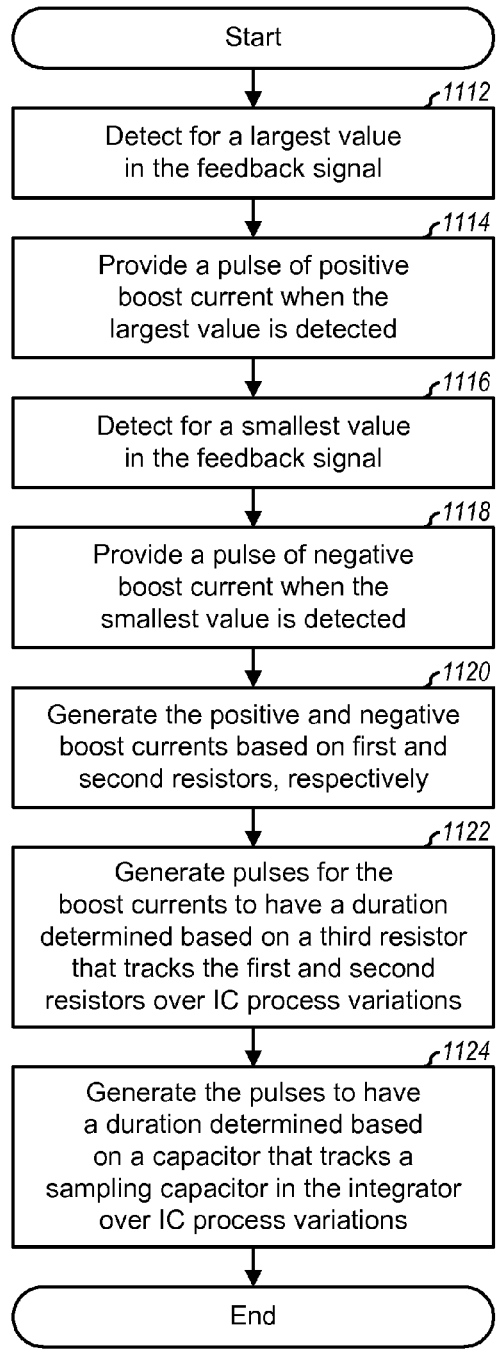
FIG. 11 shows a process for achieving slew rate enhancement.

FIG. 11 shows a design of a process for achieving slew rate enhancement in block 1014 in FIG. 10. A largest value in the feedback signal may be detected (block 1112). A pulse of positive boost current may be provided for the integrator when the largest value is detected (block 1114). A smallest value in the feedback signal may be detected (block 1116). A pulse of negative boost current may be provided for the integrator when the smallest value is detected (block 1118). The positive and negative boost currents may be generated based on first and second resistors, respectively (block 1120). The pulses for the boost currents may be generated to have a duration determined based on a third resistor that tracks the first and second resistors over IC process variations (block 1122). The pulses may also be generated to have a duration determined based on a capacitor that tracks a sampling capacitor in the integrator over IC process variations (block 1124).

In one design, a programmable amount of boost current may be generated to enhance the slew rate of the integrator. The programmable amount of boost current may be determined based on a reference voltage used for the integrator, an operating mode of the ΔΣ ADC, bandwidth of the analog signal, sampling rate of the ΔΣ ADC, the number of output bits or levels, and/or some other factor.

The techniques described herein may provide various advantages. First, the slew rate enhancement may allow an integrator to operate with a smaller bias current while achieving fast settling time. With slew rate enhancement, the settling time of the integrator may not be limited by slew rate anymore, and quiescent bias current for the integrator may be reduced significantly without degrading overall performance. Second, when the slew rate enhancement is turned off, the integrator may behave as if no slew rate enhancement circuit is added. There may be negligible or no impact to bandwidth, noise, and extra quiescent current consumption. Third, the slew rate enhancement may be achieved with relatively simple circuits, which may be implemented with few circuit components and small silicon area.

The techniques described herein may be implemented on an IC, an analog IC, an RF IC (RFIC), a mixed-signal IC, an application specific integrated circuit (ASIC), a printed circuit board (PCB), an electronics device, etc. The circuits described herein may be fabricated with various IC process technologies such as CMOS, N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the techniques described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a delta-sigma analog-to-digital converter ($\Delta\Sigma$ ADC) operative to receive an analog signal and provide digital samples, the $\Delta\Sigma$ ADC comprising:
      an integrator operative to receive an input signal and provide an output signal; and
      a slew rate enhancement circuit coupled to the integrator and operative to enhance slew rate of the integrator based on a feedback signal in the $\Delta\Sigma$ ADC, the slew rate enhancement circuit comprising:
         at least one boost circuit coupled to the integrator, each boost circuit operative to provide a boost current to enhance the slew rate of the integrator when the boost circuit is enabled, wherein each boost circuit comprises:
            a resistor and a switch coupled in series and between an output of the integrator and a supply voltage, the switch being closed to provide the boost current.

2. The apparatus of claim 1, wherein the slew rate enhancement circuit comprises:
   a first boost circuit coupled to a first output of the integrator and operative to provide a positive boost current when the first boost circuit is enabled; and
   a second boost circuit coupled to the first output of the integrator and operative to provide a negative boost current when the second boost circuit is enabled.

3. The apparatus of claim 2, wherein the slew rate enhancement circuit further comprises:
   a third boost circuit coupled to a second output of the integrator and operative to provide a positive boost current when the third boost circuit is enabled; and
   a fourth boost circuit coupled to the second output of the integrator and operative to provide a negative boost current when the fourth boost circuit is enabled, the first and second outputs forming a differential output of the integrator.

4. The apparatus of claim 1, wherein each boost circuit comprises:
   multiple sets of resistor and switch, each set comprising a resistor and a switch coupled in series and between an output of the integrator and a supply voltage, wherein a programmable number of switches is closed to provide the boost current.

5. The apparatus of claim 4, wherein the number of switches being closed for each boost circuit is determined based on at least one of a reference voltage used for the integrator, an operating mode of the $\Delta\Sigma$ ADC, bandwidth of the analog signal, and sampling rate of the $\Delta\Sigma$ ADC.

6. The apparatus of claim 1, wherein the slew rate enhancement circuit provides a pulse of boost current to enhance the slew rate of the integrator when the slew rate enhancement circuit is enabled.

7. The apparatus of claim 6, wherein duration of the pulse is determined based on an RC circuit comprising a first resistor, wherein the amount of boost current is determined based on a second resistor within the slew rate enhancement circuit, and wherein the first resistor tracks the second resistor over integrated circuit (IC) process variations.

8. The apparatus of claim 6, wherein duration of the pulse is determined based on an RC circuit comprising a first capacitor, wherein the integrator performs integration based on a sampling capacitor, and wherein the first capacitor tracks the sampling capacitor over integrated circuit (IC) process variations.

9. The apparatus of claim 6, wherein duration of the pulse and amplitude of the boost current are determined based on an amount of charge to transfer by the integrator in one sample period.

10. The apparatus of claim 1, wherein the slew rate enhancement circuit provides first and second amounts of boost current for largest and smallest values, respectively, of the feedback signal.

11. The apparatus of claim 1, wherein the slew rate enhancement circuit provides different amounts of boost current for different values of the feedback signal.

12. The apparatus of claim 1, further comprising:
   a control circuit operative to receive the feedback signal and generate at least one control signal for the slew rate enhancement circuit.

13. The apparatus of claim 12, wherein the control circuit comprises:
   a pulse generator operative to receive a control signal for the integrator and generate a first signal comprising pulses, each pulse having a duration determined based on an RC circuit; and
   a control signal generator operative to generate at least one control signal for the slew rate enhancement circuit based on the first signal from the pulse generator and the feedback signal.

14. The apparatus of claim 13, wherein the control signal generator is operative to detect for a largest value in the feedback signal, to provide a pulse on a first control signal whenever the largest value is detected, to detect for a smallest value in the feedback signal, and to provide a pulse on a second control signal whenever the smallest value is detected.

15. The apparatus of claim 1, wherein the $\Delta\Sigma$ ADC provides 2-bit digital samples, and wherein the slew rate enhancement circuit is enabled for only largest and smallest values of the digital samples.

16. The apparatus of claim 1, wherein the $\Delta\Sigma$ ADC comprises multiple integrators, and wherein the integrator is a first integrator among the multiple integrators.

17. The apparatus of claim 1, wherein the $\Delta\Sigma$ ADC is a second-order $\Delta\Sigma$ ADC comprising two integrators, and wherein the integrator is a first integrator among the two integrators.

18. The apparatus of claim 1, wherein the $\Delta\Sigma$ ADC is a cascaded $\Delta\Sigma$ ADC comprising multiple integrators, and wherein the integrator is a first integrator among the multiple integrators.

19. The apparatus of claim 1, wherein the apparatus is an integrated circuit.

20. An apparatus comprising:
   an active circuit within a feedback circuit and operative to receive an input signal and provide an output signal;
   a control circuit operative to receive a feedback signal in the feedback circuit and generate at least one control signal; and
   a slew rate enhancement circuit coupled to the active circuit and operative to receive the at least one control signal from the control circuit and to enhance slew rate of the active circuit based on the at least one control signal, the slew rate enhancement circuit comprising:
      at least one boost circuit coupled to the active circuit, each boost circuit operative to provide a boost current to enhance the slew rate of the active circuit when the boost circuit is enabled, wherein each boost circuit comprises:

a resistor and a switch coupled in series and between an output of the integrator and a supply voltage, the switch being closed to provide the boost current.

21. The apparatus of claim 20, wherein the active circuit is an integrator and the feedback circuit is a delta-sigma analog-to-digital converter (ΔΣ ADC).

22. A method comprising:
digitizing an analog signal with a delta-sigma analog-to-digital converter (ΔΣ ADC) to obtain digital samples; and
enhancing slew rate of an integrator within the ΔΣ ADC based on a feedback signal in the ΔΣ ADC, wherein the enhancing the slew rate of the integrator comprises:
detecting for a largest value in the feedback signal;
providing a pulse of positive boost current when the largest value is detected;
detecting for a smallest value in the feedback signal; and
providing a pulse of negative boost current when the smallest value is detected.

23. The method of claim 22, wherein the enhancing the slew rate of the integrator further comprises:
generating the positive boost current and the negative boost current based on first and second resistors, respectively; and
generating pulses having duration determined based on a third resistor, the third resistor tracking the first and second resistors over integrated circuit (IC) process variations.

24. The method of claim 22, wherein the enhancing the slew rate of the integrator further comprises generating pulses having duration determined based on a first capacitor, the first capacitor tracking a sampling capacitor in the integrator over integrated circuit (IC) process variations.

25. The method of claim 22, wherein the enhancing the slew rate of the integrator comprises generating a programmable amount of boost current to enhance the slew rate of the integrator, the programmable amount of boost current being determined based on at least one of a reference voltage used for the integrator, an operating mode of the ΔΣ ADC, bandwidth of the analog signal, and sampling rate of the ΔΣ ADC.

26. An apparatus comprising:
means for digitizing an analog signal with a delta-sigma analog-to-digital converter (ΔΣ ADC) to obtain digital samples; and
means for enhancing slew rate of an integrator within the ΔΣ ADC based on a feedback signal in the ΔΣ ADC, wherein the means for enhancing the slew rate of the integrator comprises:
means for detecting for a largest value in the feedback signal;
means for providing a pulse of positive boost current when the largest value is detected;
means for detecting for a smallest value in the feedback signal; and
means for providing a pulse of negative boost current when the smallest value is detected.

27. The apparatus of claim 26, wherein the means for enhancing the slew rate of the integrator further comprises:
means for generating the positive boost current and the negative boost current based on first and second resistors, respectively; and
means for generating pulses having duration determined based on a third resistor, the third resistor tracking the first and second resistors over integrated circuit (IC) process variations.

28. The apparatus of claim 26, wherein the means for enhancing the slew rate of the integrator further comprises means for generating pulses having duration determined based on a first capacitor, the first capacitor tracking a sampling capacitor in the integrator over integrated circuit (IC) process variations.

29. The apparatus of claim 26, wherein the means for enhancing the slew rate of the integrator comprises means for generating a programmable amount of boost current to enhance the slew rate of the integrator, the programmable amount of boost current being determined based on at least one of a reference voltage used for the integrator, an operating mode of the ΔΣ ADC, bandwidth of the analog signal, and sampling rate of the ΔΣ ADC.

* * * * *